(12) United States Patent
Ohkura

(10) Patent No.: US 7,230,326 B2
(45) Date of Patent: Jun. 12, 2007

(54) SEMICONDUCTOR DEVICE AND WIRE BONDING CHIP SIZE PACKAGE THEREFOR

(75) Inventor: Yoshihiro Ohkura, Iwata (JP)

(73) Assignee: Yamaha Corporation, Shizuoka-Ken (JP)

(*) Notice: Subject to any disclaimer, the term of this patent is extended or adjusted under 35 U.S.C. 154(b) by 98 days.

(21) Appl. No.: 11/214,983

(22) Filed: Aug. 31, 2005

(65) Prior Publication Data

US 2006/0049507 A1    Mar. 9, 2006

(30) Foreign Application Priority Data

Sep. 3, 2004    (JP)    ............................ P2004-256860

(51) Int. Cl.
*H01L 23/02*    (2006.01)
(52) U.S. Cl. ...................................... 257/678; 257/499
(58) Field of Classification Search ................ 257/678, 257/499
See application file for complete search history.

(56) References Cited

U.S. PATENT DOCUMENTS 6,952,048 B2 * 10/2005 Terui .......................... 257/678

FOREIGN PATENT DOCUMENTS

| JP | 6-302604 | 10/1994 |
|---|---|---|
| JP | H11-284020 | 10/1999 |
| JP | 2000-068405 | 3/2000 |
| JP | 2001-085609 | 3/2001 |
| JP | 2003-174118 | 6/2003 |
| JP | 2003-273154 | 9/2003 |
| JP | 2004-031562 | 1/2004 |

* cited by examiner

*Primary Examiner*—W. David Coleman
*Assistant Examiner*—Ankush Singal
(74) *Attorney, Agent, or Firm*—Dickstein Shapiro LLP

(57) ABSTRACT

A semiconductor device incorporated in a wire bonding chip size package (WBCSP) is designed such that a plurality of pads are formed on the surface of a semiconductor substrate and are connected to external terminals via conductive posts, wherein first and second rewiring patterns are respectively connected to the pads. All elements are sealed within an insulating layer such that the external terminals are partially exposed on the surface, wherein an uppermost portion of a conductive wire is positioned above the rewiring patterns and is also positioned below the lower ends of the external terminals. This realizes short wiring distances between the pads and the external terminals; hence, it is possible to reduce the wiring resistance and wiring delay time; it is possible to increase a freedom of degree regarding wiring without causing short-circuit failure; and, it is possible to easily change the wiring in a short period of time.

16 Claims, 8 Drawing Sheets

SEMICONDUCTOR DEVICE AND WIRE BONDING CHIP SIZE PACKAGE THEREFOR

BACKGROUND OF THE INVENTION

1. Field of the Invention

This invention relates to semiconductor devices and wire bonding chip size packages (WBCSP) therefor.

This application claims priority on Japanese Patent Application No. 2004-256860, the content of which is incorporated herein by reference.

2. Description of the Related Art

Recently, great technological advances have been achieved with respect to electronic devices such as notebook personal computers and portable telephones (or cellular phones) having digital cameras, thus realizing reduction of dimensions, reduction of thickness, and reduction of weight. For this reason, conventionally known dual inline packages have been replaced with chip size packages incorporating semiconductor devices (or semiconductor elements).

As a typical example of a chip size semiconductor device, Japanese Unexamined Patent Publication No. 2000-68405 discloses a chip size package (CSP) in which a semiconductor element is connected to a carrier substrate via metal bumps, which are formed on the lower surface of the carrier substrate so as to realize packaging with a printed-wiring board.

FIG. 10 is a cross-sectional view showing a conventionally known cross-sectional structure of a chip size package. That is, a chip size package 1 of FIG. 10 is designed such that a plurality of electrode pads 3 are formed in a prescribed pattern on an upper surface 2a of a semiconductor chip 2, onto which a base substrate 5 having the substantially same size as the semiconductor chip 2 is adhered and fixed via an adhesive layer 4, wherein signal wires 6, power wires 7, and ground wires 8 are arranged on an upper surface 5a of the base substrate 5 and are respectively accompanied by lands 6a, 7a, and 8a, which are further accompanied by ball bumps 9 serving as external terminals (which are used to establish connections with external devices). Through holes 10 running vertically through the base substrate 5 are formed at prescribed positions corresponding to the electrode pads 3. The electrode pads 3 and the wires 6 to 8 are respectively connected together via bonding wires 11. Furthermore, the upper surface 5a of the base substrate 5 is covered with a protection film 12 having insulating ability except for in prescribed areas corresponding to the ball bumps 9.

Japanese Unexamined Patent Publication No. H11-284020 discloses an example of a wire bonding chip size package (WBCSP) in which metal pads used for establishing direct connections with external devices are formed on the surface of a semiconductor substrate on which electronic circuits are formed.

FIG. 11 is a cross-sectional view showing a conventionally known cross-sectional structure of a wire bonding chip size package. That is, a WBCSP 21 is designed such that two lines of electrodes 23 are arranged in the longitudinal direction on the center area of an upper surface 22a of a semiconductor chip 22, wherein insulating films 24 are formed on both sides of the electrodes 23, and two lines of conduction pads 25 are formed on each of the insulating films 24 in the longitudinal direction of the semiconductor chip 22.

The conduction pads 25 and the electrodes 23 are connected together via bonding wires 26, wherein the bonding wires 26 are appropriately arranged in consideration of the directivity thereof and the points of connection with the conduction pads 25 in such a way that they do not mutually come in contact with each other and will not be short-circuited. Bump electrodes 27 are fixed onto the conduction pads 25. All components such as the electrodes 23, insulating films 24, conduction pads 25, and bonding wires 26 are covered with a protection film 28 having insulating ability except for in prescribed areas including top portions of the bump electrodes 27, which partially project above the overall upper surface.

In the CSP 1 shown in FIG. 10, the electrode pads 3 and the wires 6 to 8 are connected together via the bonding wires 11, having very fine dimensions, which are arranged in the through holes 10. This causes a problem in that a degree of freedom regarding wiring must be limited due to the through holes 10. When wiring is established within the same plane, the overall wiring length must be longer, which may cause another problem in that a wiring delay time is increased.

The very fine bonding wires 11 have a relatively large wiring resistance, which in turn increases a heating value thereof and imparts a bad influence to characterstics of the CSP 1.

In the WBCSP 21, the conduction pads 25 and the electrodes 23 are connected together via the bonding wires 26, whereby there is a problem in that short-circuit failure is likely to occur due to short-circuit of the bonding wires 26.

In addition, all of the conduction pads 25 and the electrodes 23 are connected using the bonding wires 26; hence, it is very difficult to reduce the overall distance between the conduction pads 25 and the electrodes. This may cause a difficulty in further reducing dimensions of the WBSCP 21.

SUMMARY OF THE INVENTION

It is an object of the invention to provide a semiconductor device and a wire bonding chip size package (WBCSP) therefor, wherein short-circuit failure is not likely to occur, a freedom of degree regarding wiring can be easily increased, and wiring can be easily changed in a short period of time.

In a first aspect of the present invention, a semiconductor device is constituted by a semiconductor substrate having a surface on which an electronic circuit is formed together with a plurality of pads; a protection film that is formed to cover the surface of the semiconductor substrate except in prescribed areas corresponding to the plurality of pads, which are respectively connected to a plurality of external terminals via conductive posts; a first rewiring pattern that is formed on the protection film and is directly connected to one of the pads; a second rewiring pattern that is formed on the protection film and is connected to another pad via a conductive wire; and an insulating layer that is formed to seal the first and second rewiring patterns, conductive wire, and conductive posts, so that the external terminals are partially exposed on a surface of the insulating layer, wherein an uppermost portion of the conductive wire is positioned above the first and second rewiring patterns and is also positioned below the lower ends of the external terminals.

In the above, the conductive wire can be arranged to lie across the first or second rewiring pattern so as to horizontally cross the first or second rewiring pattern in a plan view. In addition, the second rewiring pattern is connected with the conductive wire and is also connected to the external terminal via the conductive post. Herein, the second rewiring pattern is used for one of power supply, power distribution, and high frequency transmission. Furthermore, the first rewiring pattern is directly connected to the external terminal via the conductive post. Herein, the first rewiring pattern is used for signal transmission.

The aforementioned structure allows the manufacturer to appropriately select dimensions for the rewiring patterns, conductive posts, and conductive wire, thus realizing the shortest wiring between the pads and the external terminals; hence, it is possible to noticeably reduce wiring resistance and wiring delay time. Due to the positioning of the uppermost portion of the conductive wire, which is positioned above the rewiring patterns and below the lower ends of the external terminals, it is possible to reliably avoid the occurrence of short-circuit failure between the conductive wire and the rewiring pattern. In addition, it is possible to easily increase the degree of freedom regarding wiring, so that the wiring can be easily changed in a short period of time.

In a second aspect of the present invention, a wire bonding chip size package is provided to incorporate the aforementioned semiconductor device, in which the second rewiring pattern is connected to the other pad via a bonding wire, which is composed of gold or aluminum, for example.

In the above, each of the first and second rewiring patterns is constituted by an embedded layer and a copper rewiring layer, wherein the embedded layer has a laminated structure composed of chromium, nickel, and titanium, or has a laminated structure composed of chromium and copper, for example.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

1. First Embodiment

Figure 1:
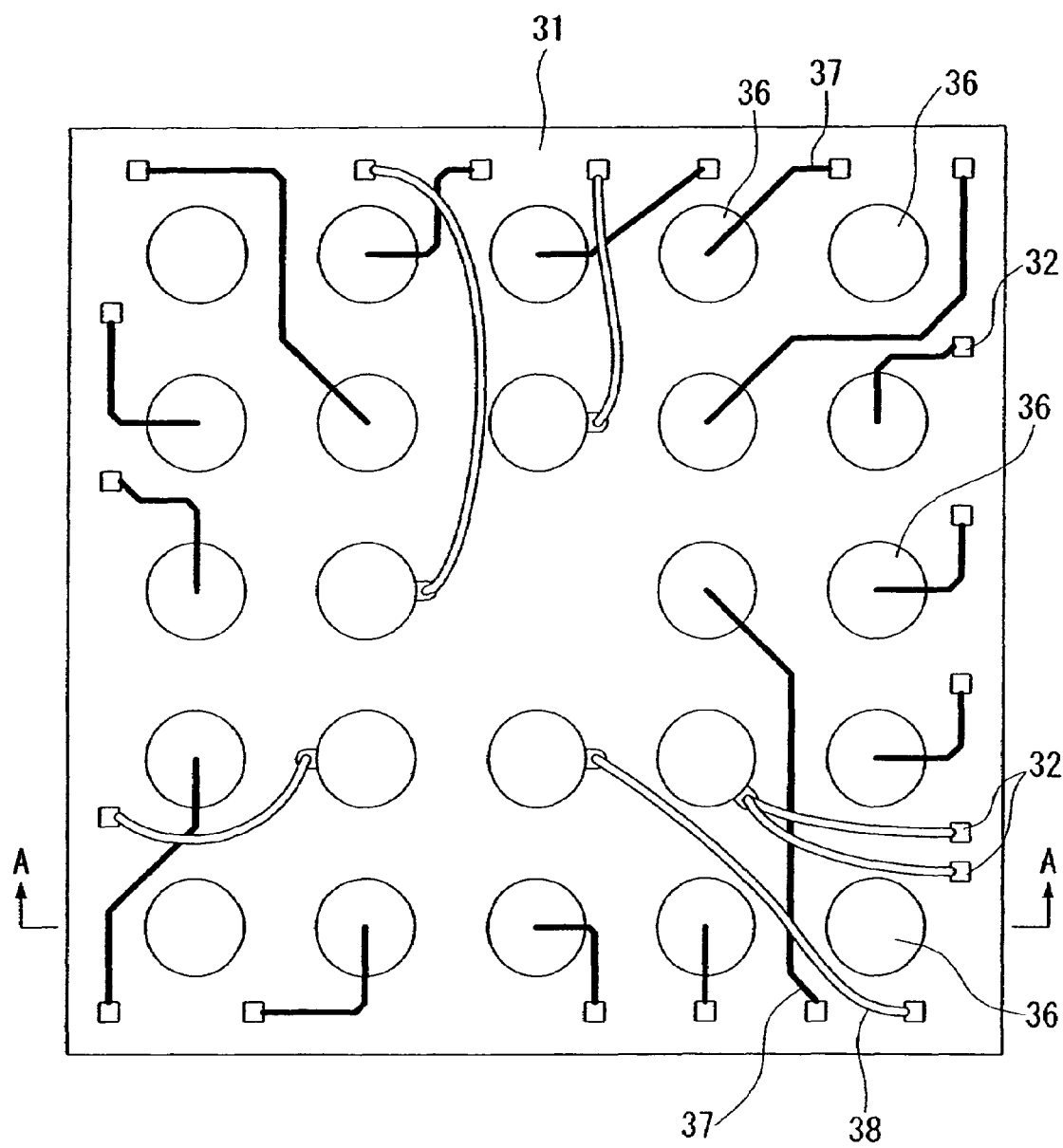
FIG. 1 is a plan view showing a wiring layout for a wire bonding chip size package (WBCSP) in accordance with a first embodiment of the present invention.
Figure 2:
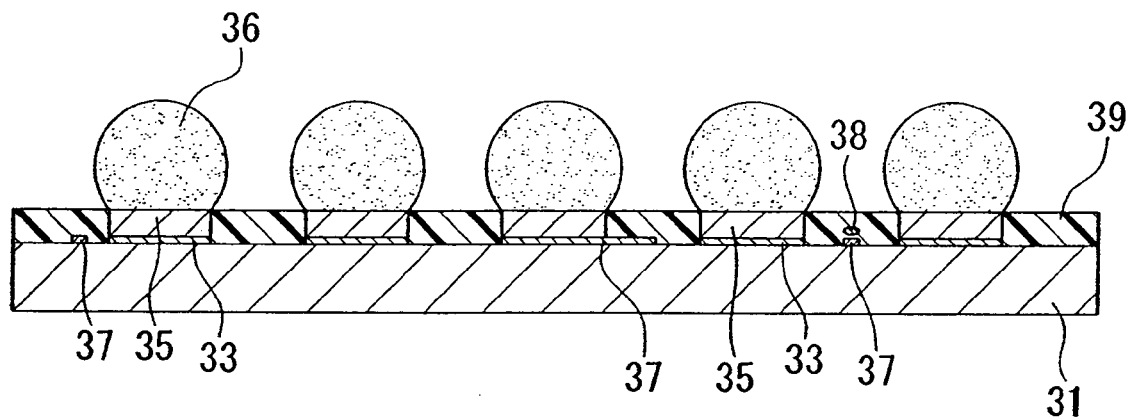
FIG. 2 is a cross-sectional view taken along line A—A in FIG. 1.

FIG. 1 is a plan view showing a wiring layout for a wire bonding chip size package (WBCSP) in accordance with a first embodiment of the present invention; and FIG. 2 is a cross-sectional view taken along line A—A in FIG. 1.

In FIGS. 1 and 2, reference numeral 31 designates a silicon substrate (or a semiconductor substrate) having substantially a rectangular shape in a plan view in which integrated circuits (or electronic circuits, not shown) are formed; reference numerals 32 designate wiring pads that are arranged in the peripheral portion of the main surface of the silicon substrate 31; reference numerals 33 designate bump pads that are disposed in the lengthwise and lateral directions on the surface of the silicon substrate 31; reference numerals 35 designate posts composed of conductive metal, which are formed on the bump pads 33 respectively; reference numerals 36 designate bump electrodes (serving as external terminals used for establishing connections with external devices), which are formed on the posts 35 respectively; reference numerals 37 designate copper re-wiring layers that are wired on the silicon substrate 31; and reference numeral 39 designates an insulating layer composed of an insulating resin, which seals the copper rewiring layers 37 and the bonding wires 38 therein.

When the bonding wire 38 is arranged to cross the copper re-wiring layer 37, the bonding wire 38 extends across the copper rewiring layer 37, and the bonding wire 38 crosses the copper rewiring layer 37 in a plan view, wherein the uppermost portion of the bonding wire 38 is positioned above the copper rewiring layer 37 and is also positioned below the lower end of the bump electrode 36.

Figure 3:
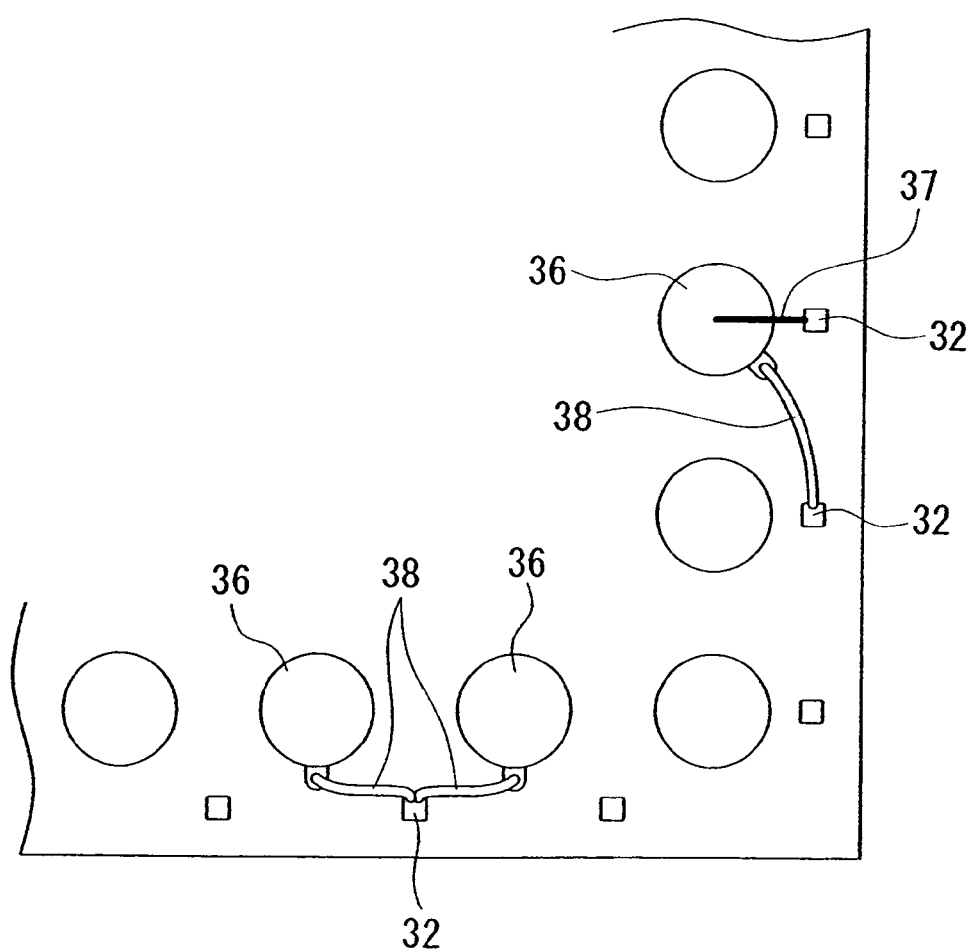
FIG. 3 is a fragmental plan view showing a modification of the wiring layout for the WBSCP according to the first embodiment.

FIG. 3 shows a modification of the wiring layout for the WBCSP, wherein the copper rewiring layer 37 and the bonding wire 38 are connected to a single bump electrode 36, and a single pad 32 is connected with two bump electrodes 36 via the bonding wire 38.

The cross-sectional structure of the WBCSP will be described with reference to FIG. 4.

An insulating layer 41 composed of silicon oxide is formed on the surface of a silicon substrate 31. A wiring pad 32 and a bump pad 33 are formed in prescribed areas on the insulating layer 41. A protection layer 42 composed of silicon oxide is formed to cover the insulating layer 41 except in the prescribed areas in which the wiring pad 32 and the bump pad 33 are formed. An insulating layer 43 composed of silicon nitride is formed on the protection layer 42. In addition, openings 44a and 45a are formed to expose the center portion of the bump pad 33; and openings 44b and 45b are formed to expose the center portion of the wiring pad 32.

A copper rewiring layer 37a is formed above the bump pad 33 by way of an embedded layer 46a composed of an under-barrier metal, which corresponds to a conductive metal having a laminated structure including chromium (Cr), nickel (Ni), and titanium (Ti), or a laminated structure including chromium (Cr) and copper (Cu). In this laminated structure, Ti or Cr has a thickness of 1800 Å, and Cu has a thickness of 6000 Å, for example. A single rewiring pattern 47a is constituted by the embedded layer 46a and the copper rewiring layer 37a.

In addition, a copper rewiring layer 37b whose thickness ranges from 4 μm to 5 μm, for example, is formed on the insulating layer 43 by way of the embedded layer 46b. Thus, a rewiring pattern 47b, which differs from the rewiring pattern 47a, is constituted by the embedded layer 46b and the copper rewiring layer 37b.

A conductive post 35a composed of copper is formed above the rewiring pattern 47a. A bump electrode 36a (serving as an external terminal for establishing connection with an external device) is formed on the conductive post 35a.

Similarly, a conductive post 35b composed of copper is formed above the rewiring pattern 47b. A bump electrode 36b (serving as an external terminal for establishing connection with an external device) is formed on the conductive post 35b.

The rewiring pattern 47b and the wiring pad 32 are connected together via a bonding wire (e.g., a conductive wire) 38. All of the rewiring patterns 47a and 47b, the conductive posts 35a and 35b, the wiring pad 32, and the bonding wire 38 are sealed within an insulating layer 39 composed of an insulating resin such as epoxy resin and polyimide resin. The bump electrodes 36a and 36b project above the surface of the insulating layer 39.

That is, the uppermost portion of the bonding wire 38 is positioned above the rewiring patterns 47a and 47b, and it is also positioned below the lower ends of the bump electrodes 36a and 36b.

Next, a manufacturing method of the WBCSP will be described.

First, an insulating layer 41 is formed on the surface of a silicon substrate 31 by way of an oxidation process. A wiring pad 32 and a bump pad 33 are formed on the insulating layer 41 by way of photolithography. A protection layer 42 composed of silicon oxide is formed on the insulating layer 41 as well as the wiring pad 32 and the bump pad 33 by way of chemical vapor deposition (CVD). Furthermore, photolithography is performed to form openings 44a and 44b for the center portion of the bump pad 33 and the center portion of the wiring pad 32 respectively.

Next, an insulating layer 43 composed of silicon oxide or silicon nitride is formed on the protection layer 42 by way of CVD. Photolithography is performed to form openings 45a and 45b so as to expose the center portion of the bump pad 33 and the center portion of the wiring pad 32 respectively.

Next, vacuum deposition or sputtering is performed to sequentially form an embedded layer and a copper rewiring layer on the insulating layer 43 and in the upper space of the bump pad 33, wherein the embedded layer is composed of a conductive metal having a laminated structure including chromium (Cr), nickel (Ni), and titanium (Ti), or a laminated structure including chromium (Cr) and copper (Cu). The embedded layer and copper rewiring layer are subjected to patterning using a prescribed wiring pattern, thus forming rewiring patterns 47a and 47b.

Next, the rewiring pattern 47b and the wiring pad 32 are connected together via a bonding wire 38, composed of gold (Au) or aluminum (Al), whose thickness ranges from 20 μm to 25 μm, for example.

In the above, the bonding wire 38 is adjusted in height and length in such a way that the uppermost portion H thereof is positioned below lower ends of the bump electrodes 36a and 36b, which are to be formed in the aftertreatment.

As a result, the uppermost portion H of the bonding wire 38 is positioned above the rewiring patterns 47a and 47b, and it is also positioned below the lower ends of the bump electrodes 36a and 36b.

Next, conductive posts 35a and 35b are respectively formed above the rewiring patterns 47a and 47b. Then, the bump electrodes 36a and 36b are respectively formed on the conductive posts 35a and 35b.

Next, in order to seal all of the rewiring patterns 47a and 47b, the conductive posts 35a and 35b, the wiring pad 32, and the bonding wire 38 within a resin, a spin-coat method is performed to apply an insulating resin such as an epoxy resin and a polyimide resin, which is heated and is then hardened using ultraviolet radiation, thus forming an insulating layer 39.

As a result, the bump electrodes 36a and 36b project upwardly from the surface of the insulating layer 39.

As described above, it is possible to completely produce the WBCSP in accordance with the first embodiment of the present invention.

As described above, the WBCSP of the first embodiment is designed and manufactured such that the rewiring pattern 47a constituted by the embedded layer 46a and the copper rewiring layer 37a is formed above the bump pad 33; the rewiring pattern 47b constituted by the embedded layer 46b and the copper rewiring layer 37b is formed on the insulating layer 43; the rewiring pattern 47b and the wiring pad 32 are connected together via the bonding wire 38; and all of the rewiring patterns 47a and 47b and the bonding wire 38 are sealed using a resin within the insulating layer 39, so that the bump electrodes 36a and 36b project upwardly from the surface of the insulating layer 39. Therefore, the manufacturer can appropriately select dimensions with respect to the rewiring patterns 47a and 47b, the conductive posts 35a and 35b, and the bonding wire 38, thus realizing wiring between the pads 32 and 33 and the bump electrodes 36a and 36b with short distances therebetween. This noticeably reduces the overall wiring resistance and the overall wiring delay time.

The present embodiment is characterized in that the uppermost portion H of the bonding wire 39 is positioned above the rewiring patterns 47a and 47b, and it is also positioned below the lower ends of the bump electrodes 36a and 36b. This reliably avoids the occurrence of short-circuit events between the bonding wire 38 and the rewiring patterns 47a and 47b.

According to the WBCSP of the present invention, it is possible to easily increase a degree of freedom regarding wiring without causing short-circuit failure, and it is possible for the manufacturer to appropriately change the wiring with ease and within a short period of time.

Incidentally, the aforementioned manufacturing method requires that the rewiring pattern and the wiring pad 32 be connected together via the bonding wire 38 before the formation of the insulating layer 39. Therefore, they can be connected together before the formation of the conductive posts 35a and 35b, for example.

In the present embodiment, the insulating layer 39 is composed of an insulating resin such as an epoxy resin and a polyimide resin. Herein, it is possible to mix fillers such as silicon oxide powder into the insulating resin.

In addition, it is possible to make the insulating layer 39 have a two-layered structure consisting of a protection layer (composed of silicon oxide, silicon nitride, or polyimide resin) and an insulating layer (composed of an insulating resin such as an epoxy resin and a polyimide resin).

2. Second Embodiment

Figure 4:
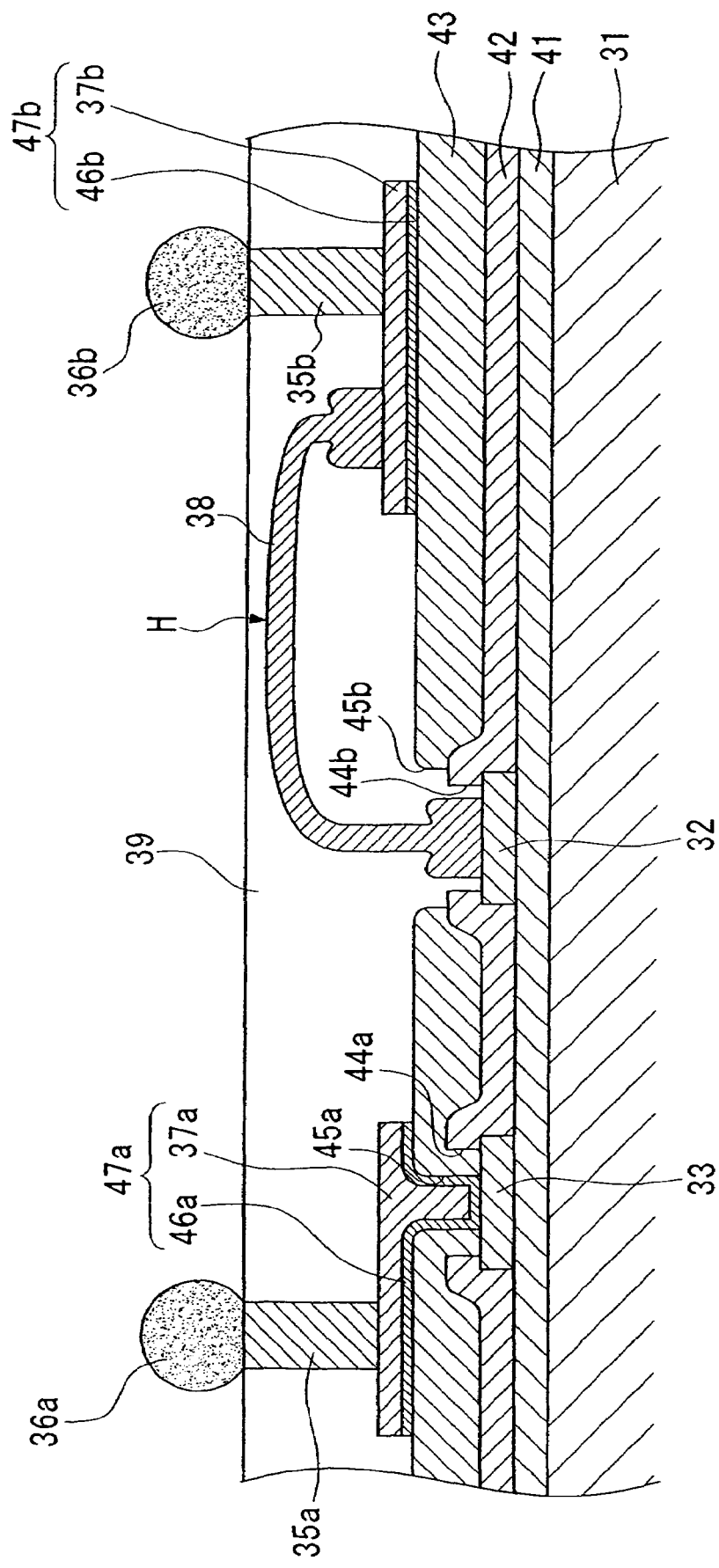
FIG. 4 is a cross-sectional view showing a wiring structure of the WBCSP according to the first embodiment.
Figure 5:
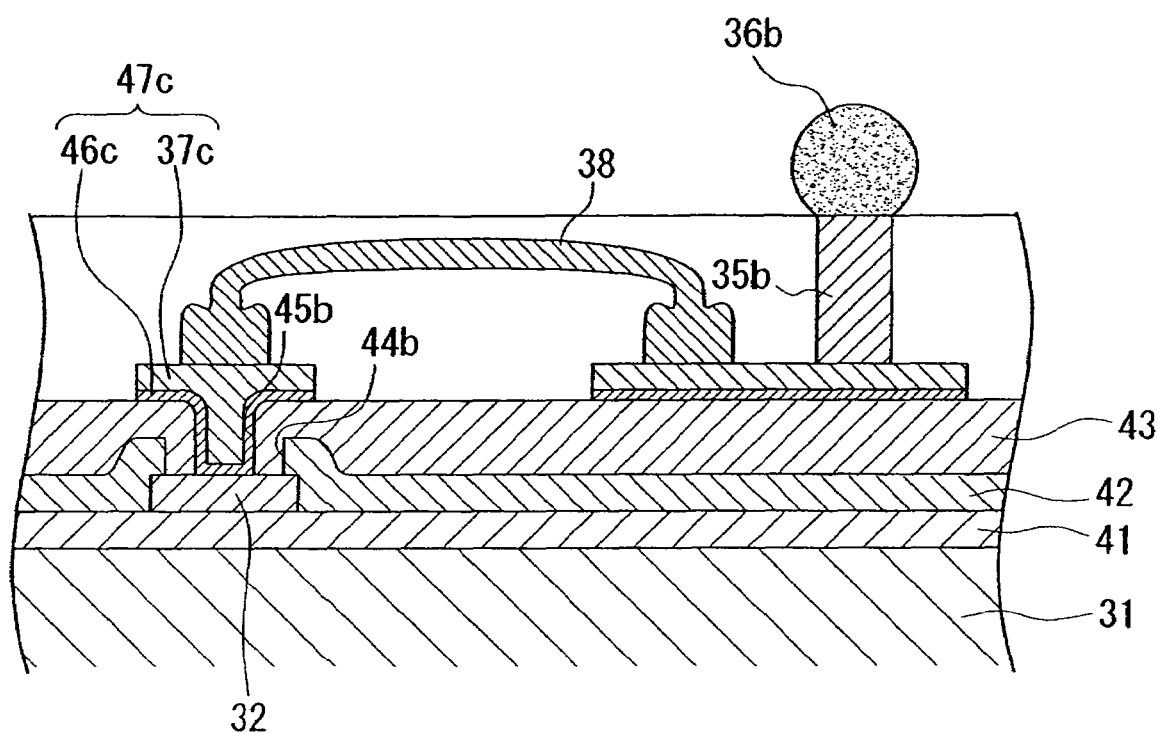
FIG. 5 is a cross-sectional view showing a cross-sectional structure of a WBCSP in accordance with a second embodiment of the present invention.

FIG. 5 is a cross-sectional view showing a structure of a WBCSP in accordance with a second embodiment of the present invention, wherein parts identical to those shown in FIG. 4 are designated by the same reference numerals. The WBCSP of the second embodiment differs from the WBCSP of the first embodiment in that in the WBCSP of the first embodiment, the rewiring pattern 47b is connected to the wiring pad 32 via the bonding wire 38, while in the WBCSP of the second embodiment, the rewiring pattern 47b is connected to another rewiring pattern 47c, consisting of an embedded layer 46c (composed of a conductive metal) and a copper rewiring layer 37c which are formed above the wiring pad 32, via the bonding wire 38.

The WBCSP of the second embodiment can demonstrate prescribed effects and operation similar to those of the WBCSP of the first embodiment.

3. Third Embodiment

Figure 6:
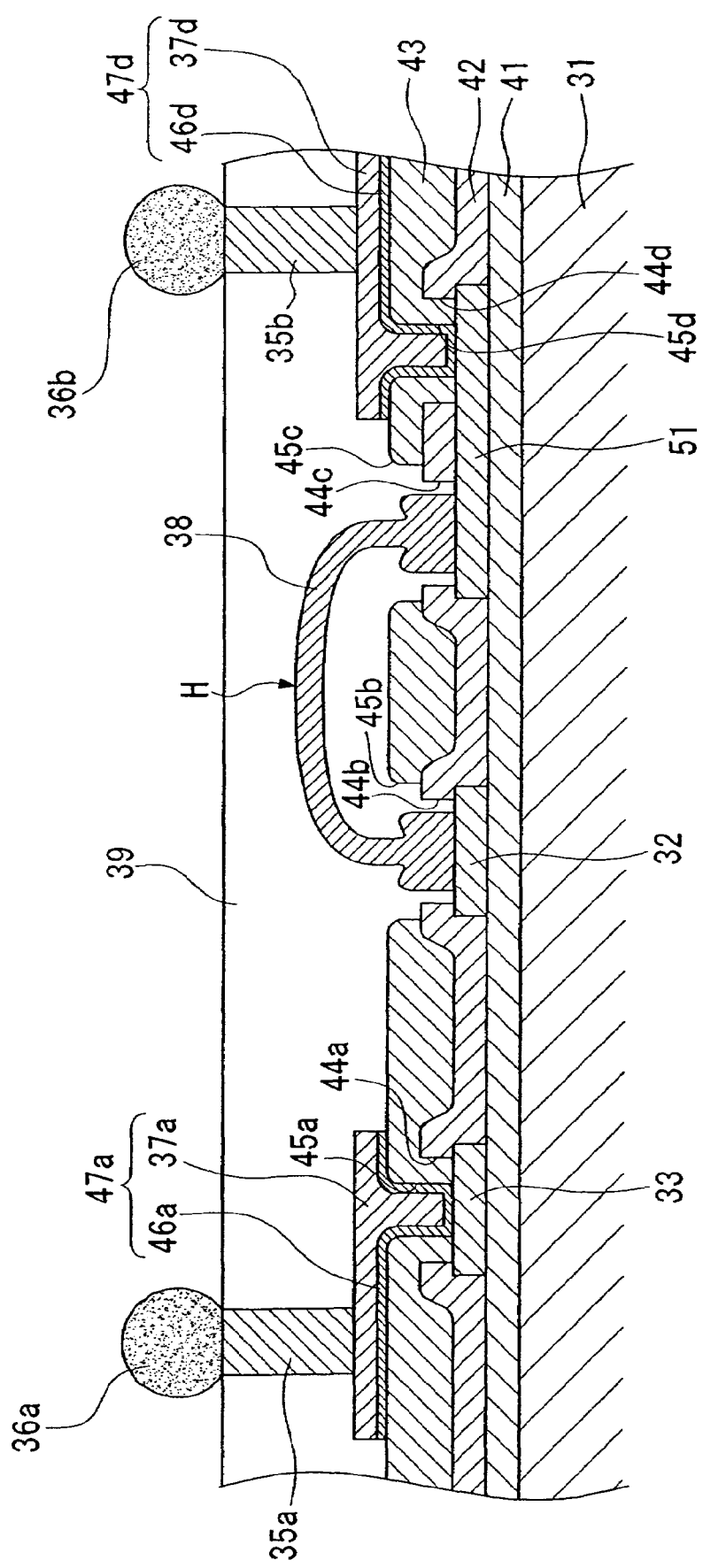
FIG. 6 is a cross-sectional view showing a cross-sectional structure of a WBCSP in accordance with a third embodiment of the present invention.

FIG. 6 is a cross-sectional view showing a structure of a WBCSP in accordance with a third embodiment of the present invention, wherein parts identical to those shown in FIG. 4 are designated by the same reference numerals. The WBCSP of the third embodiment differs from the WBCSP of the first embodiment in that in the WBCSP of the first embodiment, the conductive post 35 and the bump electrode 36b are formed above the rewiring pattern 47b, which consists of the embedded layer 46b and the copper rewiring layer 37b formed on the insulating layer 43 and which is connected to the wiring pad 32 via the bonding wire 38, while in the WBCSP of the third embodiment, a wiring/bump pad 51 is formed on the insulating layer 41; openings 44c and 45c and openings 44d and 45d are formed in the protection layer 42 and the insulating layer 43 in order to expose prescribed areas of the pad 51; a rewiring pattern 47d consisting of an embedded layer 46d and a copper rewiring layer 37d is formed above the pad 51; and the pads 32 and 51 are connected together via the bonding wire 38.

The WBCSP of the third embodiment can demonstrate prescribed effects similar to those of the WBCSP of the first embodiment.

In particular, the third embodiment has a special technical feature in that due to the connection between the pads 32 and 51 via the bonding wire 38, the uppermost portion H of the bonding wire 38 can be reduced in height as necessary.

4. Fourth Embodiment

Figure 7:
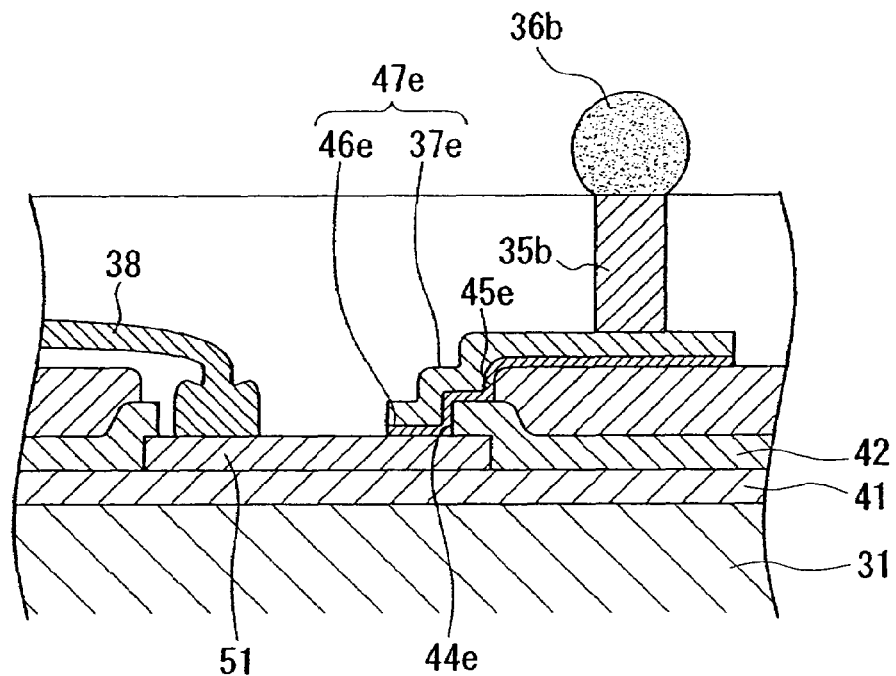
FIG. 7 is a cross-sectional view showing a cross-sectional structure of a WBCSP in accordance with a fourth embodiment of the present invention.

FIG. 7 is a cross-sectional view showing a structure of a WBCSP in accordance with a fourth embodiment of the present invention, wherein parts identical to those shown in FIG. 6 are designated by the same reference numerals. The WBCSP of the fourth embodiment differs from the WBCSP of the third embodiment in that in the WBCSP of the third embodiment, the wiring/bump pad 51 is formed on the insulating layer 41; the openings 44c and 45c and openings 44d and 45d are formed to expose the prescribed areas of the pad 51; and the rewiring pattern 47d consisting of the embedded layer 46d and the copper rewiring layer 37d is formed, while in the WBCSP of the fourth embodiment, openings 44e and 45e for exposing the pad 51 are formed in the protection layer 42 and the insulating layer 43; and a rewiring pattern 47e, consisting of an embedded layer 46e and a copper rewiring layer 37e realizing step-like opening areas in proximity to the pad 51 and the openings 44e and 45e, is formed on the insulating layer 43.

The WBCSP of the fourth embodiment can demonstrate prescribed effects and operation similar to those of the WBCSP of the third embodiment.

In particular, the fourth embodiment has a special technical feature in that only a single set of the openings 44e and 45e is required to expose the pad 51; hence, it is possible to easily produce the WBCSP of the fourth embodiment.

5. Fifth Embodiment

Figure 8:
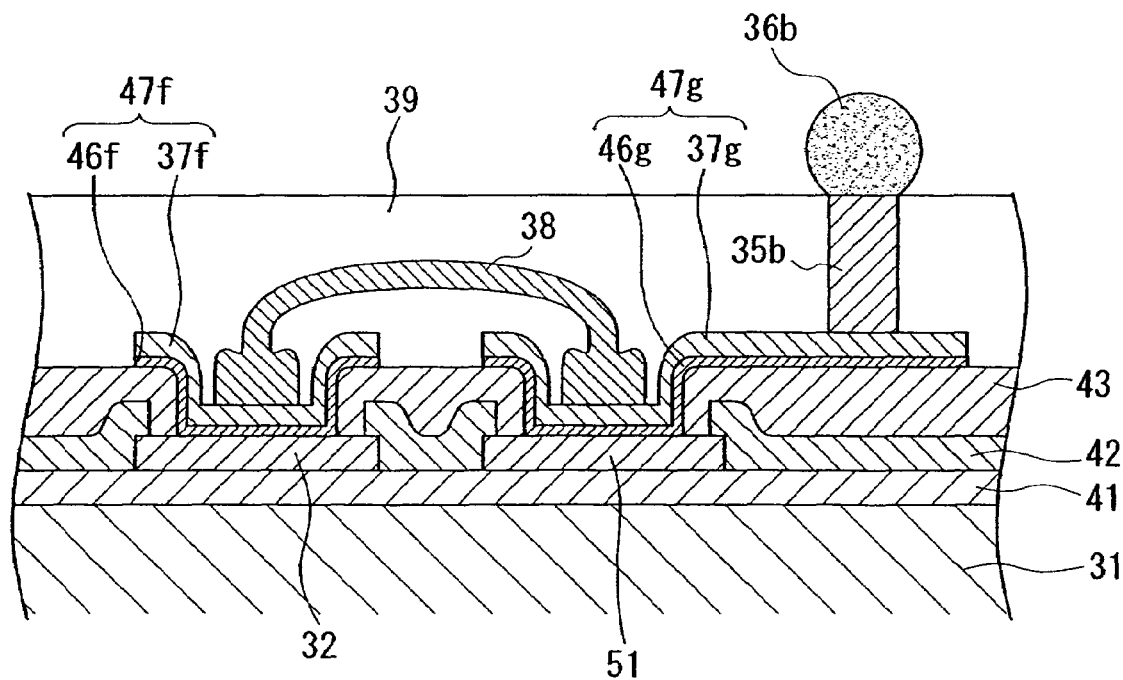
FIG. 8 is a cross-sectional view showing a cross-sectional structure of a WBCSP in accordance with a fifth embodiment of the present invention.

FIG. 8 is a cross-sectional view showing a structure of a WBCSP in accordance with a fifth embodiment of the present invention, wherein parts identical to those shown in FIG. 6 are designated by the same reference numerals. The WBCSP of the fifth embodiment differs from the WBCSP of the third embodiment in that in the WBCSP of the third embodiment, the wiring/bump pad 51 is formed on the insulating layer 41; the rewiring pattern 47d consisting of the embedded layer 46d and the copper rewiring layer 37d is formed above the pad 51 and inside of the opening 45d; and the pads 32 and 51 are directly connected together via the bonding wire 38, while in the WBCSP of the fifth embodiment, a rewiring pattern 47f consisting of an embedded layer 46f (whose center portion is hollow) and a copper rewiring layer 37f is formed above the wiring pad 32; a rewiring pattern 47g consisting of an embedded layer 46g (having a hollow in conformity with the pad 51) and a copper rewiring layer 37g is formed above the pad 51; the rewiring patterns 47f and 47g are connected together via the bonding wire 38; and the bump electrode 36b is formed on the conductive post 35b, which is formed above the rewiring pattern 47g.

The WBCSP of the fifth embodiment can demonstrate prescribed effects and operation similar to those of the WBCSP of the third embodiment.

In particular, the fifth embodiment has a special technical feature in that bonding portions at which both ends of the bonding wire 38 are bonded to the rewiring patterns 47f and 47g can be reduced in height; hence, it is possible to lower the conductive post 35b and the insulating layer 39.

6. Sixth Embodiment

Figure 9:
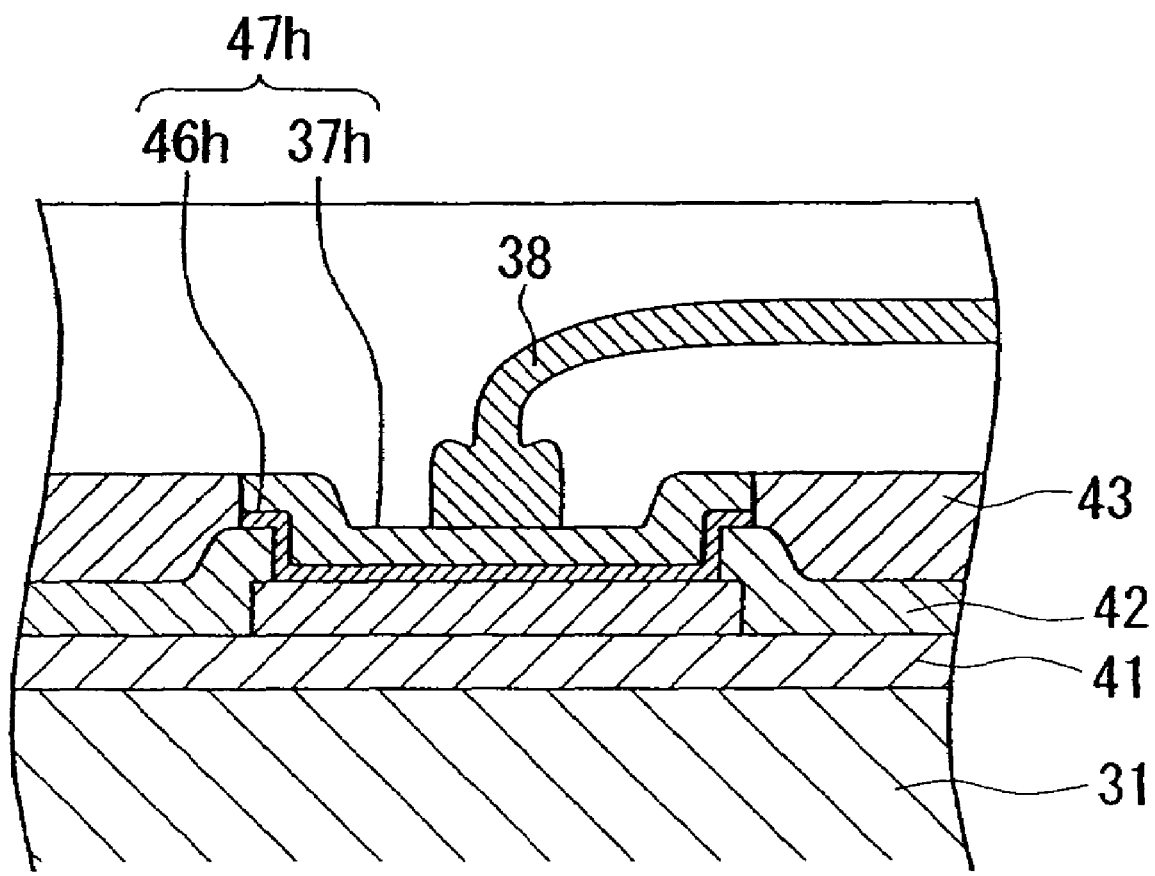
FIG. 9 is a cross-sectional view showing a cross-sectional structure of a WBCSP in accordance with a sixth embodiment of the present invention.
Figure 10:
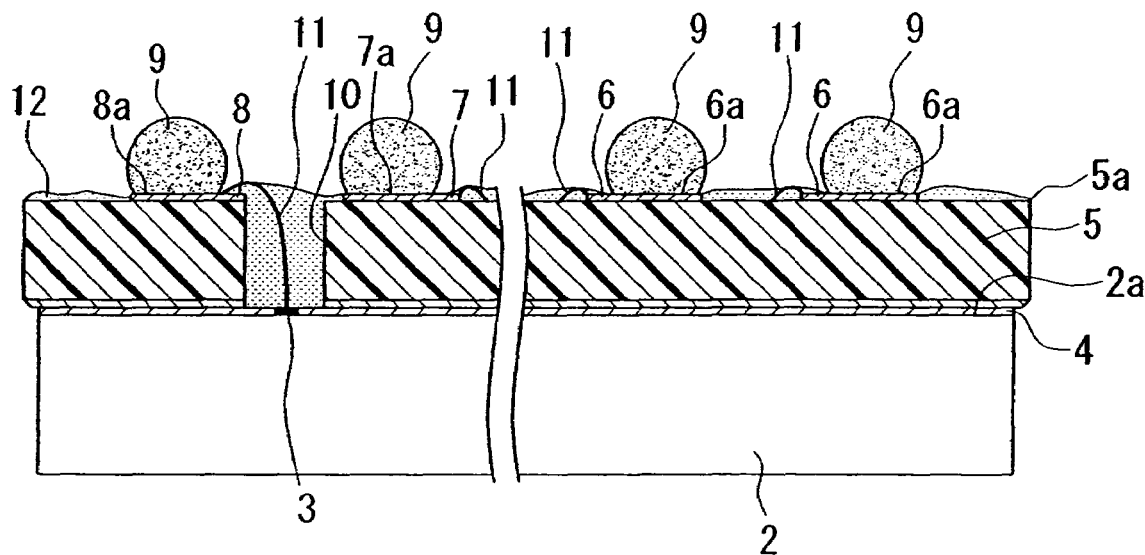
FIG. 10 is a cross-sectional view showing a cross-sectional structure of a conventionally known chip size package.
Figure 11:
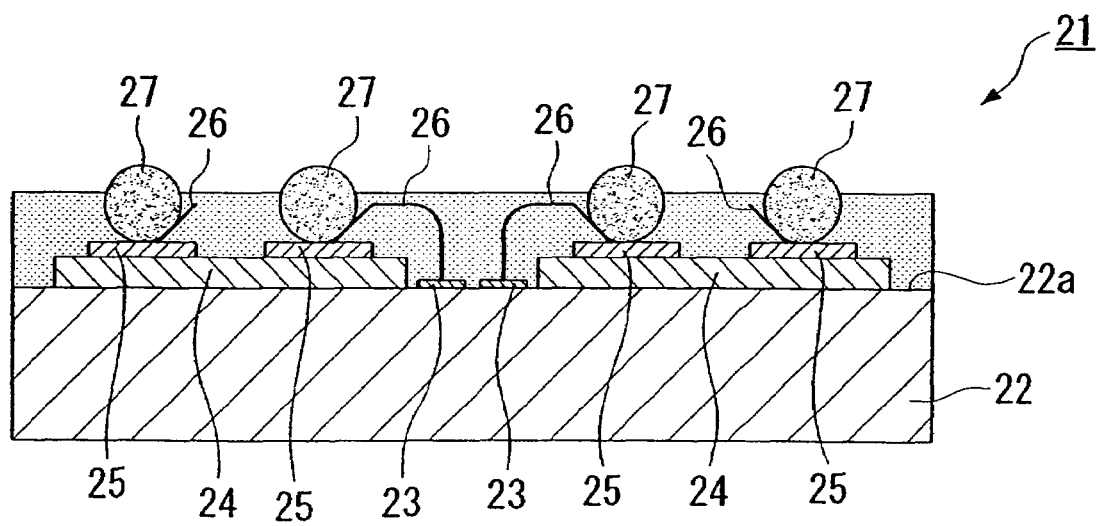
FIG. 11 is a cross-sectional view showing a cross-sectional structure of a conventionally known wire bonding chip size package.

FIG. 9 is a cross-sectional view showing a structure of a WBCSP in accordance with a sixth embodiment of the present invention, wherein parts identical to those shown in FIG. 9 are designated by the same reference numerals. The WBCSP of the sixth embodiment differs from the WBCSP of the fifth embodiment in that as shown in FIG. 9, the occupied area of the wiring pad 32 is broadened; a rewiring pattern 47h consisting of an embedded layer 46h (whose center hollow is expanded) and a copper rewiring layer 37h is formed above the wiring pad 32; the peripheral area of the rewiring pattern 47h is embedded within the insulating layer 43; and the bonding wire 38 is connected to the center portion of the rewiring pattern 47h.

The WBCSP of the sixth embodiment can demonstrate prescribed effects and operation similar to those of the WBCSP of the fifth embodiment.

As described heretofore, the present embodiment is basically designed such that the rewiring pattern 47a is formed above the bump pad 33; the rewiring pattern 47b is formed above the insulating layer 43; the rewiring pattern 47b and the wiring pad 32 are connected together via the bonding wire 38; the uppermost portion H of the bonding wire 38 is positioned above the rewiring patterns 47a and 47b; and the uppermost portion H is also positioned below the lower ends of the bump electrodes 36a and 36b.

Due to the sophisticated structure described above, the present invention can be applied to any type of WBCSP as well as other types of CSP incorporating semiconductor chips; hence, it is possible to provide excellent industrial effects for manufacturers producing semiconductor devices and packages.

Lastly, this invention can be embodied in several forms without departing from the essential technical features thereof; hence, the present invention is not necessarily limited to the aforementioned embodiments, which are illustrative and not restrictive.

What is claimed is:

1. A semiconductor device comprising:
    a semiconductor substrate having a surface on which an electronic circuit is formed together with a plurality of pads;
    a protection film that is formed to cover the surface of the semiconductor substrate except in prescribed areas corresponding to the plurality of pads, which are respectively connected to a plurality of external terminals via conductive posts;
    a first rewiring pattern that is formed on the protection film and is directly connected to one of the pads;
    a second rewiring pattern that is formed on the protection film and is connected to another of the pads via a conductive wire; and
    an insulating layer that is formed to seal the first and second rewiring patterns, the conductive wire, and the conductive posts, so that the external terminals are partially exposed on a surface of the insulating layer,
    wherein an uppermost portion of the conductive wire is positioned above the first and second rewiring patterns and is also positioned below lower ends of the external terminals.

2. A semiconductor device according to claim 1, wherein the conductive wire lies across the first or second rewiring pattern so as to horizontally cross the first or second rewiring pattern in a plan view.

3. A semiconductor device according to claim 1, wherein the second rewiring pattern is connected with the conductive wire and is also connected to the external terminal via the conductive post.

4. A semiconductor device according to claim 3, wherein the second rewiring pattern is used for one of power supply, power distribution, and high frequency transmission.

5. A semiconductor device according to claim 1, wherein the first rewiring pattern is connected to the external terminal via the conductive post.

6. A semiconductor device according to claim 5, wherein the first rewiring pattern is used for signal transmission.

7. A semiconductor device according to claim 1, wherein each of the first and second rewiring patterns is constituted by an embedded layer and a copper rewiring layer.

8. A semiconductor device according to claim 7, wherein the embedded layer has a laminated structure composed of chromium, nickel, and titanium.

9. A semiconductor device according to claim 7, wherein the embedded layer has a laminated structure composed of chromium and copper.

10. A semiconductor device according to claim 1, wherein the conductive wire is composed of gold or aluminum.

11. A wire bonding chip size package incorporating a semiconductor device, which comprises a semiconductor substrate having a surface on which an electronic circuit is formed together with a plurality of pads;
    a protection film that is formed to cover the surface of the semiconductor substrate except in prescribed areas corresponding to the plurality of pads, which are respectively connected to a plurality of external terminals via conductive posts;
    a first rewiring pattern that is formed on the protection film and is directly connected to one of the pads;
    a second rewiring pattern that is formed on the protection film and is connected to another of the pads via a bonding wire; and
    an insulating layer that is formed to seal the first and second rewiring patterns, the conductive wire, and the conductive posts, so that the external terminals are partially exposed on a surface of the insulating layer,
    wherein an uppermost portion of the conductive wire is positioned above the first and second rewiring patterns and is also positioned below lower ends of the external terminals.

12. A wire bonding chip size package according to claim 11, wherein the bonding wire lies across the first or second rewiring pattern so as to horizontally cross the first or second rewiring pattern in a plan view.

13. A wire bonding chip size package according to claim 11, wherein each of the first and second rewiring patterns is constituted by an embedded layer and a copper rewiring layer.

14. A wire bonding chip size package according to claim 13, wherein the embedded layer has a laminated structure composed of chromium, nickel, and titanium.

15. A wire bonding chip size package according to claim 14, wherein the embedded layer has a laminated structure composed of chromium and copper.

16. A wire bonding chip size package according to claim 11, wherein the bonding wire is composed of gold or aluminum.

* * * * *